US012592728B2

(12) United States Patent
Passamani

(10) Patent No.: US 12,592,728 B2
(45) Date of Patent: Mar. 31, 2026

(54) DIGITAL-TO-ANALOG CONVERTER WITH LOCALIZED FREQUENCY MULTIPLICATION CIRCUITS

(71) Applicant: Apple Inc., Cupertino, CA (US)

(72) Inventor: Antonio Passamani, Munich (DE)

(73) Assignee: Apple Inc., Cupertino, CA (US)

( * ) Notice: Subject to any disclaimer, the term of this patent is extended or adjusted under 35 U.S.C. 154(b) by 645 days.

(21) Appl. No.: 17/899,450

(22) Filed: Aug. 30, 2022

(65) Prior Publication Data

US 2024/0072829 A1     Feb. 29, 2024

(51) Int. Cl.
*H04B 1/04*     (2006.01)
*H03M 1/06*     (2006.01)

(52) U.S. Cl.
CPC ............ *H04B 1/04* (2013.01); *H03M 1/0604* (2013.01)

(58) Field of Classification Search
CPC ..... H04B 1/04; H04B 1/0475; H03M 1/0604; H03M 1/662
See application file for complete search history.

(56) References Cited

U.S. PATENT DOCUMENTS

| | | | | | |
|---|---|---|---|---|---|
| 5,963,071 | A * | 10/1999 | Dowlatabadi | ...... | H03K 5/00006 |
| | | | | | 327/276 |
| 6,930,627 | B1 * | 8/2005 | Hopkins | .................. | H04B 1/40 |
| | | | | | 342/171 |
| 7,532,679 | B2 * | 5/2009 | Staszewski | ........... | H04L 27/361 |
| | | | | | 375/295 |

| | | | | | |
|---|---|---|---|---|---|
| 8,803,720 | B2 * | 8/2014 | Dufrene | .................. | H03F 3/245 |
| | | | | | 341/147 |
| 9,184,974 | B1 * | 11/2015 | Baringer | ............. | H04L 27/2637 |
| 9,647,678 | B2 * | 5/2017 | Passamani | ............. | H04L 27/00 |
| 9,722,645 | B2 * | 8/2017 | Markovic | ............ | H04L 27/364 |
| 9,973,178 | B1 * | 5/2018 | Holzmann | ......... | H03K 5/00006 |
| 10,567,154 | B1 * | 2/2020 | Wentzloff | ............. | H03L 7/0995 |
| 10,587,354 | B1 * | 3/2020 | Hamidovic | .......... | H04B 17/354 |
| 10,938,465 | B1 * | 3/2021 | Mehrnia | .............. | H04B 7/0837 |
| 11,431,092 | B1 * | 8/2022 | Jacquet | ................... | H01Q 3/42 |
| 12,166,495 | B2 * | 12/2024 | Passamani | .......... | H03M 1/0604 |
| 2003/0071665 | A1 * | 4/2003 | Oyama | ................. | H03L 7/0814 |
| | | | | | 327/116 |

(Continued)

OTHER PUBLICATIONS

Nguyen et al., "A mm-Wave Switched-Capacitor RFDAC," IEEE Journal of Solid-State Circuits, vol. 57, No. 4, Apr. 2022, https://doi.org/10.1109/JSSC.2022.3142718 , pp. 1224-1238.

*Primary Examiner* — Jinsong Hu
*Assistant Examiner* — Rui M Hu
(74) *Attorney, Agent, or Firm* — FLETCHER YODER PC

(57) ABSTRACT

The current disclosure is related to digital-to-analog converters (DACs) with localized frequency multiplication circuits. For example, an electronic device may include a local oscillator (LO) providing clock signals, a digital front-end providing digital signals, a DAC, (e.g., a radio frequency DAC (RFDAC)), and one or more antennas. The DAC may include a number of cells (e.g., unit power amplifiers). Moreover, each cell may provide a unit power analog signal upon activation with a higher frequency than the received digital signals and clock signals. The DAC may provide an output signal (e.g., an analog signal) based on combining (e.g., aggregating) the unit power analog signals of the activated cells for transmission by the one or more antennas.

20 Claims, 10 Drawing Sheets

(56)         References Cited

U.S. PATENT DOCUMENTS

| | | | |
|---|---|---|---|
| 2003/0085766 A1* | 5/2003 | Rogerson | H04L 25/4902 |
| | | | 331/57 |
| 2004/0131130 A1* | 7/2004 | Shor | H04L 27/206 |
| | | | 375/308 |
| 2006/0109893 A1* | 5/2006 | Chen | H04L 27/364 |
| | | | 375/219 |
| 2006/0276154 A1* | 12/2006 | Kaewell, Jr. | H04J 3/0685 |
| | | | 455/258 |
| 2007/0159220 A1* | 7/2007 | Jacobsson | G06F 7/68 |
| | | | 327/116 |
| 2009/0073013 A1* | 3/2009 | Pozsgay | H04L 27/36 |
| | | | 341/144 |
| 2011/0069767 A1* | 3/2011 | Zhu | H04L 27/368 |
| | | | 375/259 |
| 2011/0267127 A1* | 11/2011 | Staszewski | H03M 1/68 |
| | | | 327/306 |
| 2013/0234873 A1* | 9/2013 | Wyville | H03M 1/661 |
| | | | 341/144 |
| 2014/0154997 A1* | 6/2014 | Chen | H04B 3/46 |
| | | | 455/67.14 |
| 2014/0314178 A1* | 10/2014 | Seo | H03M 9/00 |
| | | | 375/296 |
| 2016/0329935 A1* | 11/2016 | Singerl | H04B 1/0475 |
| 2019/0317731 A1* | 10/2019 | Tangudu | H03D 7/161 |
| 2020/0266842 A1* | 8/2020 | Patel | H04B 1/04 |
| 2021/0067182 A1* | 3/2021 | Ravi | H04B 1/0458 |
| 2022/0321393 A1* | 10/2022 | Mohammadnezhad | |
| | | | H04L 27/361 |
| 2022/0329248 A1* | 10/2022 | Azam | H03L 7/1978 |
| 2023/0046481 A1* | 2/2023 | Tarver | H04B 17/12 |

* cited by examiner

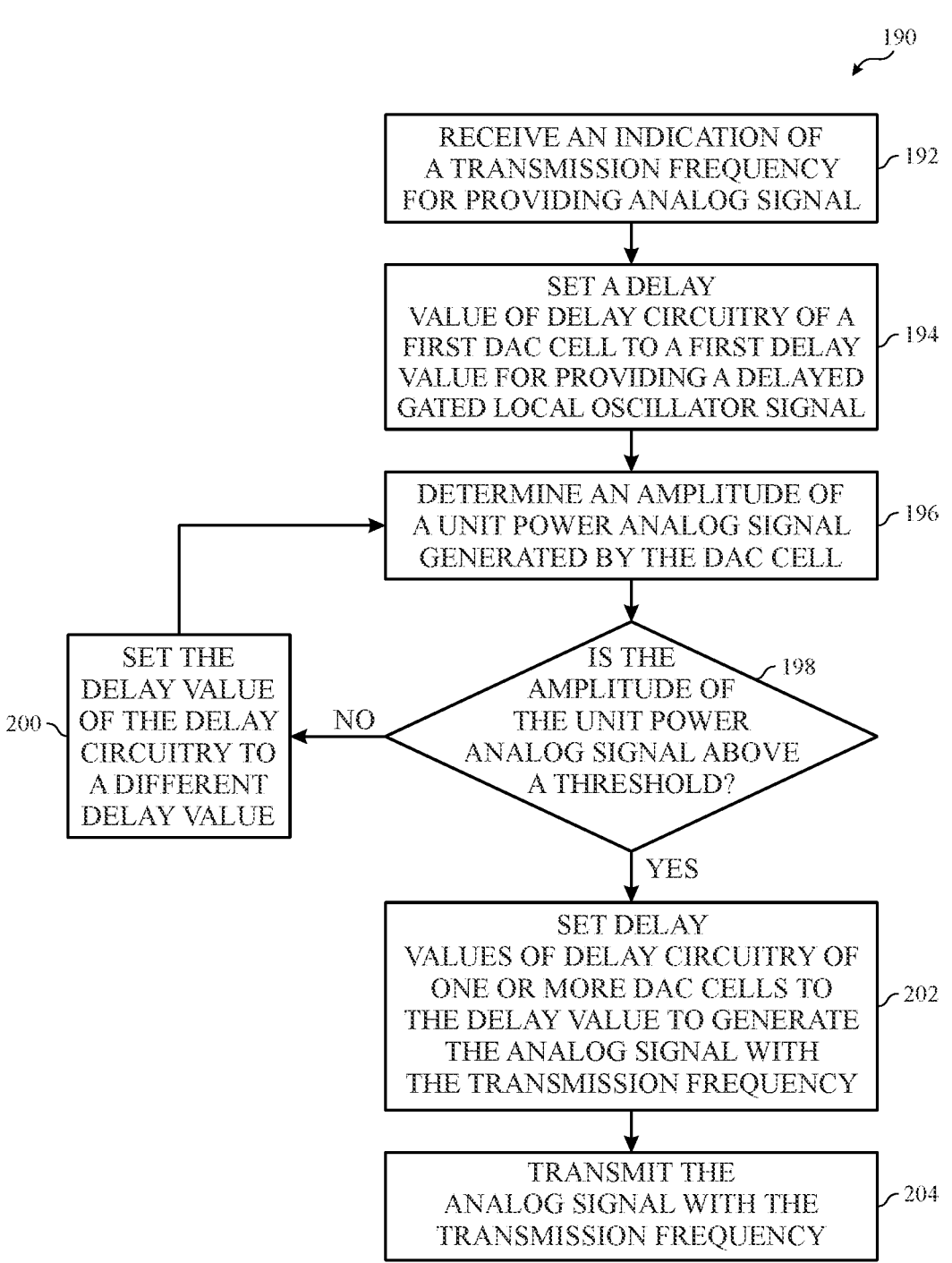

190

RECEIVE AN INDICATION OF
A TRANSMISSION FREQUENCY
FOR PROVIDING ANALOG SIGNAL ⎯ 192

SET A DELAY
VALUE OF DELAY CIRCUITRY OF A
FIRST DAC CELL TO A FIRST DELAY
VALUE FOR PROVIDING A DELAYED
GATED LOCAL OSCILLATOR SIGNAL ⎯ 194

DETERMINE AN AMPLITUDE OF
A UNIT POWER ANALOG SIGNAL
GENERATED BY THE DAC CELL ⎯ 196

SET THE
DELAY VALUE
OF THE DELAY
CIRCUITRY TO
A DIFFERENT
DELAY VALUE ⎯ 200

IS THE
AMPLITUDE OF
THE UNIT POWER
ANALOG SIGNAL ABOVE
A THRESHOLD? ⎯ 198

NO

YES

SET DELAY
VALUES OF DELAY CIRCUITRY OF
ONE OR MORE DAC CELLS TO
THE DELAY VALUE TO GENERATE
THE ANALOG SIGNAL WITH
THE TRANSMISSION FREQUENCY ⎯ 202

TRANSMIT THE
ANALOG SIGNAL WITH THE
TRANSMISSION FREQUENCY ⎯ 204

FIG. 16

DIGITAL-TO-ANALOG CONVERTER WITH LOCALIZED FREQUENCY MULTIPLICATION CIRCUITS

BACKGROUND

This disclosure generally relates to digital-to-analog converters (DACs) with reduced clock signal frequencies.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Numerous electronic devices—including televisions, portable phones, computers, wearable devices, vehicle dashboards, virtual-reality glasses, and more—utilize DACs to generate analog electrical signals from digitally coded data. For example, an electronic device may use one or more DACs to convert digital signals to analog signals for transmission via radio frequency (RF) circuitry. In some embodiments, a DACs may include different circuitry for generating the analog signals with different transmission frequencies.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a radio frequency (RF) transmitter is described. The RF transmitter may include a local oscillator (LO) and a digital-to-analog converter (DAC) coupled to the LO. The DAC receiving the LO signal from the LO. The LO may output a LO signal with a first frequency. The DAC may include multiple cells, each cell including first frequency multiplication circuitry and a capacitor. The first frequency multiplication circuitry of each cell may receive a bitstream with the first frequency based on the LO signal. Moreover, first frequency multiplication circuitry of each cell may output the bitstream with a second frequency, the second frequency being higher than the first frequency.

In another embodiment, an electronic device is described. The electronic device may include a processor, one or more antennas, and a transmitter. The processor may generate a bitstream with a first frequency, the bitstream corresponding to a transmission signal. The one or more antennas may transmit the transmission signal. The transmitter may include a local oscillator (LO) and a digital-to-analog converter (DAC). The DAC may be coupled to the LO. The LO may output a LO signal with the first frequency. The DAC may receive the LO signal from the LO and may receive the bitstream from the processor. The DAC may output an analog signal corresponding to the transmission signal based on the bitstream and the LO signal. The analog signal may have a second frequency higher than the first frequency.

In yet another embodiment, a method is described. The method may include receiving an indication to transmit a transmission signal with a transmission frequency by a processor of an electronic device. The method may also include providing one or more control signals to a digitalto-analog converter (DAC) by the processor. The one or more control signals may select a frequency multiplication factor of the DAC for generating the transmission signal. Moreover, the method includes providing one or more control signals to the DAC by the processor. The one or more control signals may select a frequency multiplication factor of the DAC for generating the transmission signal. The method may also include providing a bitstream with an input frequency corresponding to the transmission signal to the DAC by the processor. The input frequency may be a fraction of the transmission frequency based on the frequency multiplication factor.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

FIG. 16 is a flowchart of a process for determining a phase delay of the first programmable delay circuit of FIG. 14 or the second programmable delay circuit of FIG. 15 associated with the frequency multiplication circuitry of FIG. 12 based on a selected transmission frequency for generating the analog signal by the first cells of FIG. 6 or the second cells of FIG. 9, in accordance with an embodiment of the present disclosure.

DETAILED DESCRIPTION OF SPECIFIC EMBODIMENTS

Figure 1:
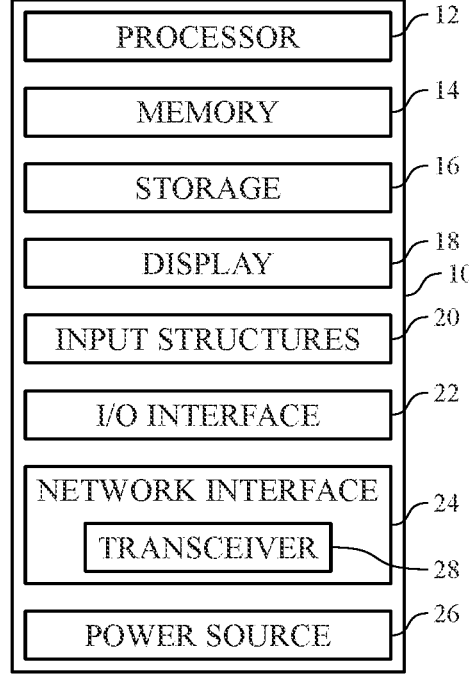
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

The current disclosure is related to digital-to-analog converters (DACs) with localized frequency multiplication circuits. For example, a transmitter of an electronic device may include a local oscillator (LO), a digital front-end (DFE), and a DAC, (e.g., a radio frequency DAC (RFDAC)), coupled to one or more antennas. The DFE may include a processor, a microcontroller, a logic circuit, or any combination thereof. The DAC may include a number of cells (e.g., unit power amplifiers). Moreover, each cell may provide a unit power analog signal upon activation. The DAC may provide an output signal (e.g., an analog signal)

based on combining (e.g., aggregating) the unit power analog signals of the activated cells for transmission by the one or more antennas.

In some cases, the LO may provide a LO signal with a first frequency to each of the cells. Moreover, the digital front-end may provide bitstreams (e.g., digital data) with the first frequency targeting one or more cells of the DAC. The targeted cells of the DAC may become activated upon receiving input signals (e.g., a bitstream and the LO signal). For example, the targeted cells may receive the bitstream and the LO signal in synchronization with each other (e.g., with the first frequency and/or in-phase with each other or with a delayed phase with respect to each other). Moreover, each cell may include frequency multiplication circuitry. Accordingly, each activated cell may generate the unit power analog signal with a second frequency that may be double (e.g., nearly double, approximately double), quadruple (e.g., nearly quadruple, approximately quadruple), and so on, that of the first frequency, as will be appreciated.

Increasing the frequency of signals at the cells of the DAC using the frequency multiplication circuitry may enable reducing a frequency of operation of the local oscillator, the digital front-end, and digital circuitry coupled to the digital front-end. In some cases, reducing the operating frequency may reduce power consumption of the electronic device. Moreover, the DAC may generate output signals (e.g., analog signals) at the second frequency that are at high frequency (e.g., higher than 10 gigahertz (GHz), higher than 15 GHz, higher than 20 GHz, higher than 25 GHz, and so on), which may be multiple times higher (e.g., double, quadruple, and so on) than the first frequency of the input signals. Accordingly, in some cases, the electronic device may not include one or more amplification stages (e.g., a mixer), filtration stages, among other things based on including the frequency multiplication circuitry with the cells of the DAC. In such cases, a linearity of the output signal may also improve over different frequencies based on the reduced number of stages and/or components at non-DAC components (e.g., the LO, the digital front-end) for generating the output signal. Moreover, in specific cases, reducing the number of stages and/or components may also reduce a surface area of the transmitter, and therefore, costs associated with the DAC.

With the foregoing in mind, FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 20, an input/output (I/O) interface 22, a network interface 24, and a power source 26. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 20, the input/output (I/O) interface 22, the network interface 24, and/or the power source 26 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 20 of the electronic device 10 may enable a user to interact with the electronic device 10 (e.g., pressing a button to increase or decrease a volume level). The I/O interface 22 may enable electronic device 10 to interface with various other electronic devices, as may the network interface 24. In some embodiments, the I/O interface 22 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 24 may include, for example, one or more interfaces for a personal area network (PAN), such as an ultra-wideband (UWB) or a BLUETOOTH® network, for a local area network (LAN) or wireless local area network (WLAN), such as a network employing one of the IEEE 522.11x family of protocols (e.g., WI-FIC), and/or for a wide area network (WAN), such as any standards related to the Third Generation Partnership Project (3GPP), including, for example, a 3rd generation (3G) cellular network, universal mobile telecommunication system (UMTS), 4th generation (4G) cellular network, long term evolution (LTE®) cellular network, long term evolution license assisted access (LTE-LAA) cellular network, 5th generation (5G) cellular network, and/or New Radio (NR) cellular network, a satellite network, and so on. In particular, the network interface 24 may include, for example, one or more interfaces for using a Release-15 cellular communication standard of the 5G specifications that include the millimeter wave (mmWave) frequency range (e.g., 22.25-300 GHz) and/or any other cellular communication standard release (e.g., Release-16, Release-17, any future releases) that define and/or enable frequency ranges used for wireless communication. The network interface 24 of the electronic device 10 may allow communication over the aforementioned networks (e.g., 5G, Wi-Fi, LTE-LAA, and so forth).

The network interface 24 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 24 may include a transceiver 28. In some embodiments, all or portions of the transceiver 28 may be disposed within the processor 12. The transceiver 28 may support transmission and receipt of various wireless signals via one or more antennas, and thus may include a transmitter and a receiver. The power source 26 of the electronic device 10 may include any suitable source of power, such as a rechargeable lithium polymer (Li-poly) battery and/or an alternating current (AC) power converter. In certain embodiments, the electronic device 10 may take the form of a computer, a portable electronic device, a wearable electronic device, or other type of electronic device.

Figure 2:
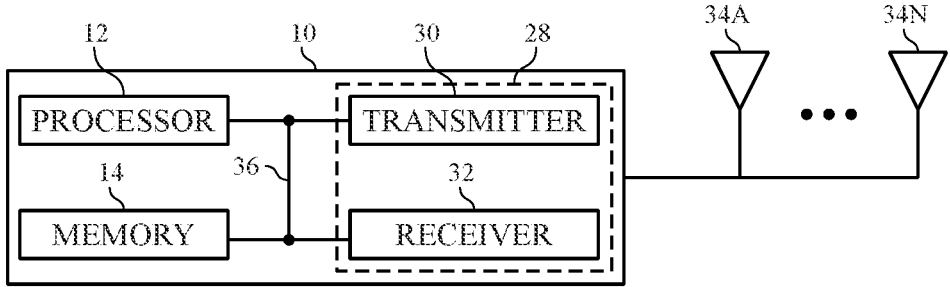
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 28, a transmitter 30, a receiver 32, and/or one or more antennas 34 may be communicatively coupled directly or indirectly (e.g., through or via another component, a communication bus, a network) to one another to transmit and/or receive data between one another.

The electronic device 10 may include the transmitter 30 and/or the receiver 32 that respectively enable transmission and reception of data between the electronic device 10 and an external device via, for example, a network (e.g., including base stations) or a direct connection. As illustrated, the transmitter 30 and the receiver 32 may be combined into the transceiver 28. The electronic device 10 may also have one or more antennas 34A-34N electrically coupled to the transceiver 28. The antennas 34A-34N may be configured in an omnidirectional or directional configuration, in a single-beam, dual-beam, or multi-beam arrangement, and so on.

Each of the antennas 34A-34N may be associated with one or more beams and various configurations. In some embodiments, multiple antennas of the antennas 34A-34N of an antenna group or module may be communicatively coupled to a respective transceiver 28 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 30 and the receiver 32 may transmit and receive information via other wired or wireline systems or means.

As illustrated, the various components of the electronic device 10 may be coupled together by a bus system 36. The bus system 36 may include a data bus, for example, as well as a power bus, a control signal bus, and a status signal bus, in addition to the data bus. The components of the electronic device 10 may be coupled together or accept or provide inputs to each other using some other mechanism.

Figures 3, 4:
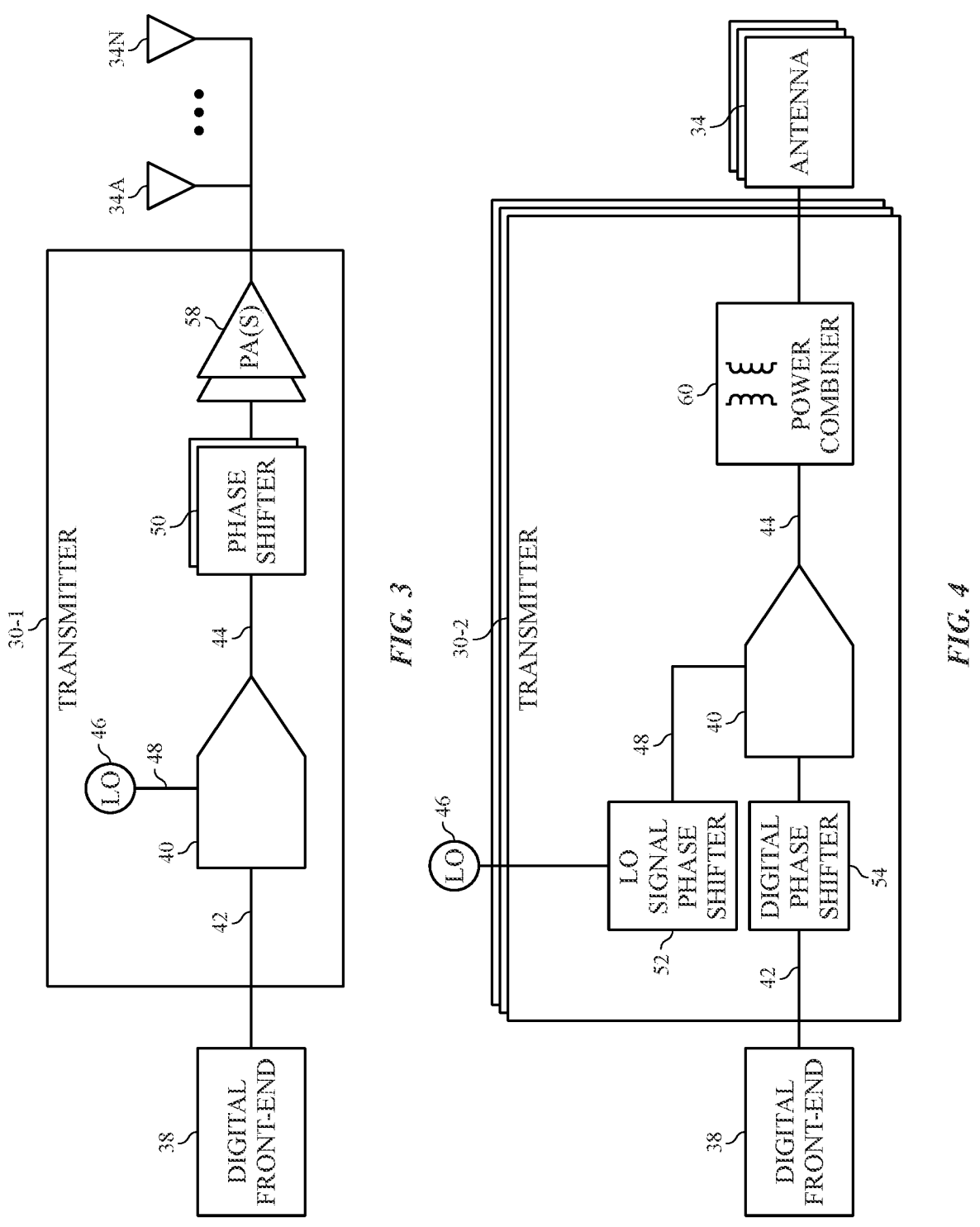
FIG. 3 is a block diagram of a transmitter of the electronic device of FIG. 1 including a phase shifter coupled to an output of a digital-to-analog converter (DAC), according to embodiments of the present disclosure.
FIG. 4 is a block diagram of a portion of the electronic device of FIG. 1 including phase shifters coupled to inputs of the DAC, in accordance with an embodiment of the present disclosure.

FIG. 3 is a schematic diagram of a first embodiment of the transmitter 30 (e.g., a transmitter 30-1) and FIG. 4 is a schematic diagrams of a second embodiment of the transmitter 30 (e.g., a transmitter 30-2), according to embodiments of the present disclosure. As illustrated, the transmitters 30-1 and 30-2 may receive outgoing data in the form of a bitstream 42 (e.g., a digital signal) to be transmitted via the one or more antennas 34. In the depicted embodiment, a digital front-end (DFE) 38 may provide the bitstream 42 to the transmitters 30-1 and 30-2. Moreover, in the depicted embodiment, multiple transmitters 30-2 may be coupled to a single DFE 38. In some embodiments, the transmitters 30-2 may each couple to a respective set of the one or more antennas 34. In some cases, the DFE 38 may include the processor 12. Alternatively or additionally, the DFE 38 may include any other viable circuitry to provide the bitstream 42 to the transmitters 30-1 and 30-2. The transmitters 30-1 and 30-2 may each include a digital-to-analog converter (DAC) 40 to convert the bitstream 42 to an analog signal 44 combined with a carrier signal to generate a radio wave. Additionally, while embodiments are described herein as applying to RF signal generation, in some embodiments, aspects of the present disclosure may be applicable to other types or utilizations of DACs, such as a baseband DAC.

The DAC 40 may include multiple cells to generate the analog signal 44 upon receiving the bitstream 42 and an LO signal 48. For example, the DFE 38 may provide the bitstream 42 targeting one or more of the cells of the DAC 40. Moreover, each targeted cell of the DAC 40 may generate a unit power analog signal. A combination (e.g., aggregation) of the unit power analog signals of the targeted cells of the DAC 40 may correspond to the analog signal 44 (e.g., a modulated signal).

Each cell of the DAC 40 may include frequency multiplication circuitry to generate the respective unit power analog signals with RF frequency (e.g., mmWave frequency), as opposed to baseband or intermediate frequency. As such, in the depicted embodiments, an LO 46 may provide one LO signal 48 (e.g., a clock signal) to the DAC 40, as opposed to providing multiple LO signals with multiple clock frequencies for baseband and/or intermediary frequency signals. In specific cases, the LO 46 may be common to (e.g., coupled to) multiple transmitters 30 of the electronic device 10. For example, the multiple transmitters 30 may operate at a similar frequency range (e.g., in a frequency band, with similar frequency, with identical frequency) for beamforming. In some cases, the DAC 40 may only receive the LO signal 48 as the clock signal. For example, the LO 46 may generate the LO signal 48 with a same or similar frequency to the bitstream 42. Moreover, the DAC 40 may provide the analog signal 44 with a higher frequency (e.g., double, quadruple, and so on) compared to a frequency of the LO signal 48 and the bitstream 42 based on including the frequency multiplication circuitry with the cells. The frequency multiplication circuitry of the cells may provide the unit power analog signals, and therefore the analog signal 44, with the higher frequency based on a multiplication factor. Accordingly, the LO signal 48 and the bitstream 42 may have a fraction of the frequency of the analog signal 44. In some cases, a mixer and/or a filter may not be needed to provide the analog signal 44 with a desired frequency, as the DAC 40 may already perform this step using the frequency multiplication circuitry with the cells.

In some embodiments, the analog signal 44 may include quadrature analog signals including an in-phase (I) component and a quadrature (Q) component. Moreover, if not compensated for, the DAC 40 may disturb (e.g., increase) a phase difference between the in-phase component and the quadrature component of the quadrature analog signals as the DAC 40 generates the analog signal 44 with the higher frequency. Accordingly, in FIG. 3, the transmitter 30-1 may include a phase shifter 50 coupled to an output of the DAC 40. In some cases, the phase shifter 50 compensate for such phase differences. Moreover, in some embodiments, the phase shifter 50 may provide beam-forming capability over an antenna 34, a group of antennas 34, and/or multiple groups of antennas 34. An optional power amplifier (PA) 58 may amplify the analog signal 44 received from the phase shifter 50 to a suitable level to drive transmission of the signal via the one or more antennas 34. The power amplifier 58 may be optional depending on output power requirements.

Moreover, in FIG. 4, the transmitter 30-2 may include an LO signal phase shifter 52 and a digital phase shifter 54. In some embodiments, the LO signal phase shifter 52 may provide the LO signal 48 based on adjusting (e.g., providing 45 degrees or 90 degrees delay) a signal received from the LO 46. For example, the LO signal phase shifter 52 may receive a single signal from the LO 46 and provide in-phase and quadrature signals that are out of phase by 45 degrees or 90 degrees. Moreover, in some cases, the digital phase shifter 54 may compensate for the phase difference between the in-phase component and the quadrature component of the analog signal 44 (e.g., the output signals) by adjusting phases of the bitstream 42 (e.g., the input signals). For example, the LO signal phase shifter 52 and the digital phase shifter 54 may divide the LO signal 48 and the bitstream 42 by a divisor inversely proportional to the multiplication factor of the frequency multiplication circuitry. Accordingly, the DAC 40 may generate the in-phase component and the quadrature component of the analog signal 44 with a desirable phase difference (e.g., a 90 degree phase difference). In the depicted embodiment, the transmitter 30-2 may include an optional power combiner 60 that may receive the analog signal 44 from the DAC 40 to amplify the analog signal 44 to a suitable level to drive transmission of the signal via the one or more antennas 34. The power combiner 60 may be optional depending on output power requirements.

Figure 5:
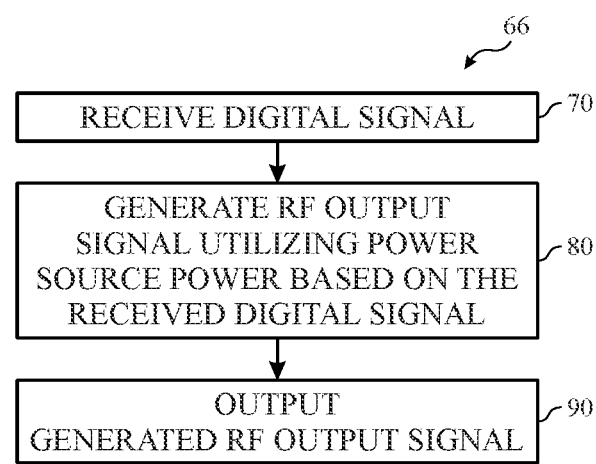
FIG. 5 is a flowchart of a method for converting a digital signal to a radio frequency (RF) signal (e.g., a millimeter wave (mmWave) signal) using the DACs of FIGS. 3 and 4, in accordance with an embodiment of the present disclosure.

FIG. 5 is a flowchart of a method 66 for converting a digital signal to a RF signal (e.g., an mmWave signal) using the DAC 40, according to an embodiment of the present disclosure. At block 70, the DAC 40 may receive a digital signal (e.g., the bitstream 42 in FIGS. 3 and 4). At block 80, the DAC 40 may generate an RF (e.g., mmWave) output signal (e.g., the analog signal 44), utilizing power from the power source 26 (shown in FIG. 1), based on the received digital signal. As mentioned above, the DAC 40 may provide the analog signal 44 with a higher frequency (e.g., double, quadruple, and so on) compared to a frequency of a clock signal (e.g., the LO signal 48) and the digital signal (e.g., the bitstream 42) based on including the frequency multiplication circuitry with the cells. Moreover, at block 90, the generated RF output signal (e.g., with the higher frequency compared to the digital signal) may be output from the DAC 40.

As discussed above, the DAC 40 may generate an RF output signal by enabling one or more unit cells to output a unit amount of current or voltage that, in the aggregate, form the RF output signal. The unit current or voltage may be predetermined and based on implementation factors. For example, the unit cells may include one or more capacitors that store a fixed amount of charge that may be released to form the RF output signal.

Figure 6:
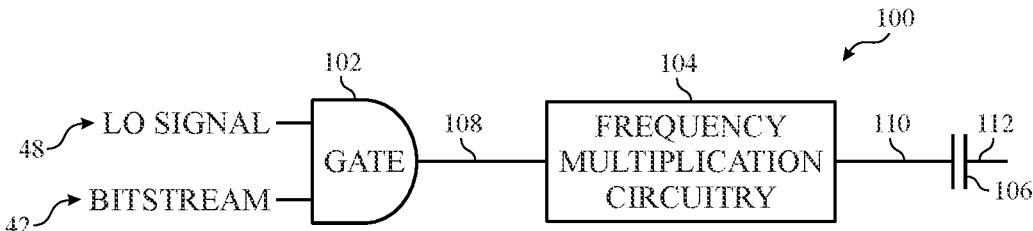
FIG. 6 is a block diagram of a first cell of the DAC of FIGS. 3 and 4 having a multiplication factor of two, in accordance with an embodiment of the present disclosure.

As mentioned above, the DAC 40 (e.g., a fractal DAC, a column and line DAC, among other DACs) may include multiple cells. Moreover, the DFE 38 may provide the bitstream 42 targeting one or more of the cells of the DAC 40. FIG. 6 depicts a block diagram of a first cell 100 of the DAC 40, in accordance with embodiments of the present disclosure. In some embodiments, the DAC 40 may include an array of cells, at least some of which have the same or similar components of the first cell 100, as will be appreciated. In the depicted embodiment, the first cell 100 includes a gate 102 (e.g., an AND gate as illustrated, a NAND gate, an OR gate, and so on), frequency multiplication circuitry 104, and a capacitor 106. It should be appreciated that in alternative or additional embodiments, the first cell 100 may include additional or different circuitry.

Figure 7:
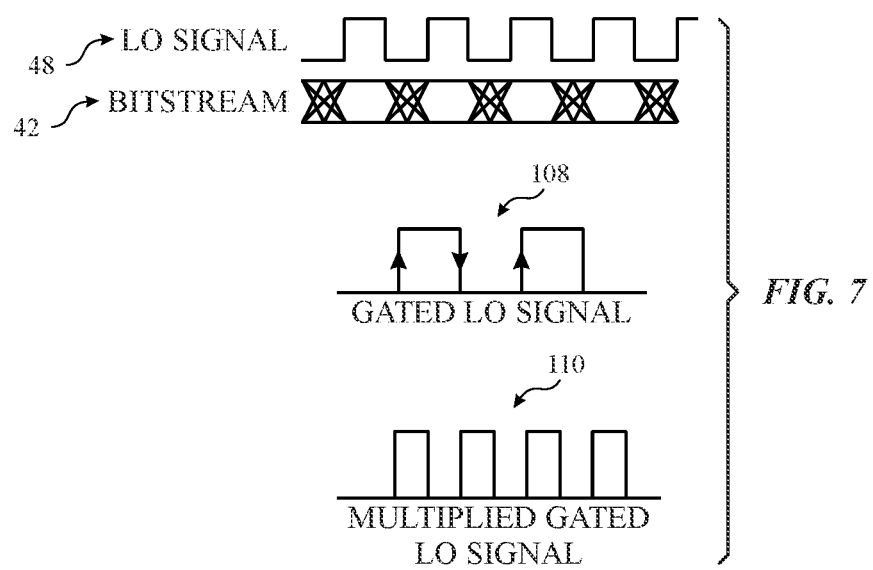
FIG. 7 illustrates a local oscillator (LO) signal, a bitstream, a gated LO signal, and a multiplied gated LO signal of the first cell of FIG. 6, in accordance with an embodiment of the present disclosure.

The gate 102 may receive the LO signal 48 and the bitstream 42 when the first cell 100 is targeted. FIG. 7 depicts the LO signal 48 and the bitstream 42, as well as a gated LO signal 108 and a multiplied gated LO signal 110. In some cases, the gate 102 may receive the LO signal 48 and the bitstream 42 in synchronization with each other (e.g., in-phase or with a phase delay with respect to each other). Moreover, the gate 102 may provide the gated LO signal 108 based on receiving the bitstream 42 and the LO signal 48. The gated LO signal 108 may include a number of pulses of the LO signal 48 corresponding to data bits of the bitstream 42. For example, the gated LO signal 108 may have an improved spectral purity (e.g., signal to noise ratio (SNR)) compared to the data bits of the bitstream 42.

The frequency multiplication circuitry 104 may receive the gated LO signal 108 to provide the multiplied gated LO signal 110 to the capacitor 106. As mentioned above, the frequency multiplication circuitry 104 may provide the multiplied gated LO signal 110 with higher frequency compared to the gated LO signal 108 based on a multiplication factor. In FIG. 7, the multiplied gated LO signal 110 is depicted with double the frequency of the gated LO signal 108. Accordingly, the frequency multiplication circuitry 104 may include circuitry for providing an output signal based on a multiplication factor of two, as will be appreciated. Moreover, in different embodiments, the frequency multiplication circuitry 104 may include different circuitry for providing the multiplied gated LO signal 110 based on a different multiplication factor, as will be discussed in more details below. In any case, the capacitor 106 may generate a unit power analog signal 112 based on receiving the multiplied gated LO signal 110. For example, pulses (e.g., data bits) of the multiplied gated LO signal 110 may charge the capacitor 106 to provide the unit power analog signal 112 corresponding to the bitstream 42.

Figure 8:
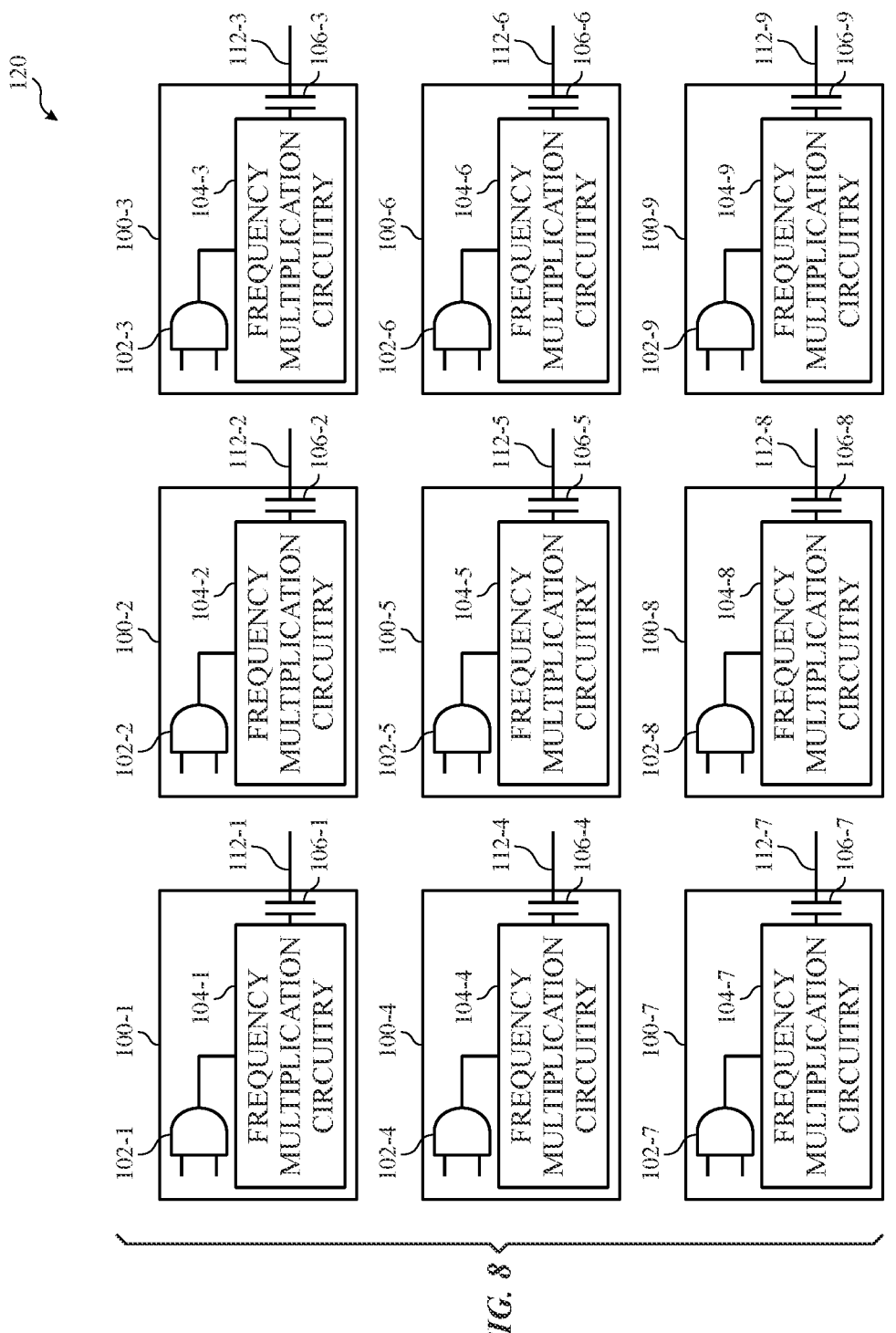
FIG. 8 is a DAC including a first array of the first cells of FIG. 6, in accordance with an embodiment of the present disclosure.

FIG. 8 depicts the DAC 40 including a first array 120 of the first cells 100. Although nine first cells 100-1, 100-2, 100-3, 100-4, 100-5, 100-6, 100-7, 100-8, and 100-9 are shown in the depicted embodiment, it should be appreciated that in different embodiments, the first array 120 of the DAC 40 may include any number (e.g., more or less) of first cells 100. Moreover, as mentioned above, each first cell 100-1, 100-2, 100-3, 100-4, 100-5, 100-6, 100-7, 100-8, and 100-9 may receive the LO signal 48. Furthermore, the DFE 38 may provide the bitstream 42 targeting one or more of the first cells 100-1, 100-2, 100-3, 100-4, 100-5, 100-6, 100-7, 100-8, and 100-9. For example, the first cells 100-1, 100-2, 100-3, 100-4, 100-5, 100-6, 100-7, 100-8, and 100-9 may receive the LO signal 48 and/or the bitstream 42 with a first frequency. Moreover, each targeted first cell 100-1, 100-2, 100-3, 100-4, 100-5, 100-6, 100-7, 100-8, and/or and 100-9 may generate a respective unit power analog signal 112-1, 112-2, 112-3, 112-4, 112-5, 112-6, 112-7, 112-8, and/or 112-9 with a second frequency, based on the frequency multiplication circuitry 104 including circuitry for providing an output signal based on a multiplication factor (e.g., of two). Moreover, the first array 120 may combine (e.g., aggregate) the unit power analog signals 112-1, 112-2, 112-3, 112-4, 112-5, 112-6, 112-7, 112-8, and 112-9 to generate the analog signal 44, as discussed above. In this manner, the first array 120 may generate output signal (e.g., the analog signal 44) with double the frequency of the input signals (e.g., the LO signal 48).

Figures 9, 10:
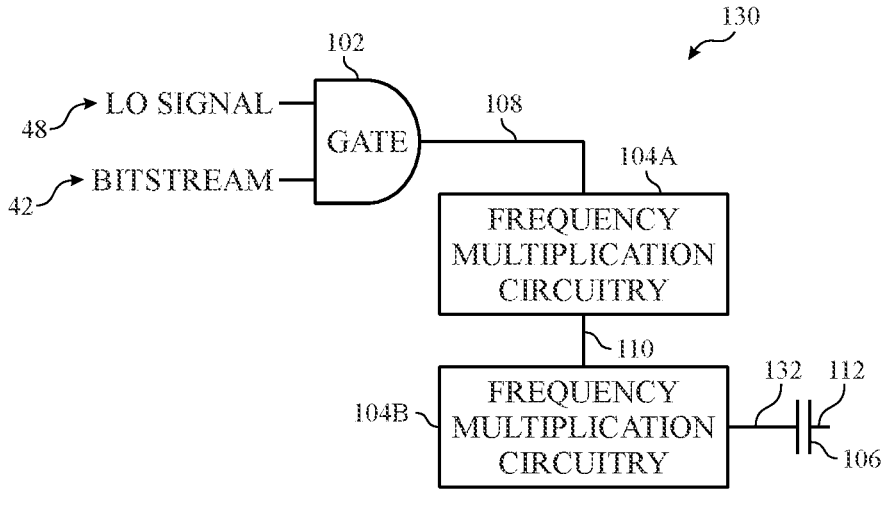
FIG. 9 is a block diagram of a second cell of the DAC of FIGS. 3 and 4 having a multiplication factor of four, in accordance with an embodiment of the present disclosure.
FIG. 10 illustrates a LO signal, a bitstream, a gated LO signal, a multiplied gated LO signal, and a double multiplied gated LO signal of the second cell of FIG. 9, in accordance with an embodiment of the present disclosure.

FIG. 9 depicts a block diagram of a second cell 130 of the DAC 40, in accordance with embodiments of the present disclosure. For example, the DAC 40 may include an array of cells each having a block diagram similar (or substantially similar) to the block diagram of the second cell 130. Similar to the first cell 100 the second cell 130 may include the gate 102 and the capacitor 106. In the depicted embodiment, the second cell 130 includes first frequency multiplication circuitry 104A and second frequency multiplication circuitry 104B coupled in series (e.g., cascaded) between the gate 102 and the capacitor 106. In different embodiments, the first frequency multiplication circuitry 104A and the second frequency multiplication circuitry 104B may include similar or different circuit components. The first frequency multiplication circuitry 104A may receive the gated LO signal 108 to provide the multiplied gated LO signal 110. As mentioned above, in some cases, the DAC 40 may only receive the LO signal 48 as the clock signal. Moreover, the second frequency multiplication circuitry 104B may receive the multiplied gated LO signal 110 to provide a double multiplied gated LO signal 132, thus quadrupling output signal frequency (e.g., frequency of the analog signal 44) compared to the input signal frequencies (e.g., frequencies of the bitstream 42 and/or the LO signal 48).

FIG. 10 depicts the gated LO signal 108, the multiplied gated LO signal 110, and the double multiplied gated LO signal 132 of the second cell 130. In the depicted embodiment, the multiplied gated LO signal 110 and the double multiplied gated LO signal 132 are each depicted with double the frequency of the gated LO signal 108 and the multiplied gated LO signal 110, respectively. For example, the first frequency multiplication circuitry 104A and the second frequency multiplication circuitry 104B may each include circuitry associated with providing a multiplication factor two (e.g., a total multiplication factor of four). Accordingly, the second cell 130-2 may quadruple a frequency of the LO signal 48 and the bitstream 42 for generating the unit power analog signal 112. In different embodiments, the first frequency multiplication circuitry 104A and the second frequency multiplication circuitry 104B may include circuitry associated with providing a different multiplication factor. Moreover, in alternative or additional embodiment, any suitable number of frequency multiplication circuitries (e.g., 3, 4, 5, or more) may be chained or cascaded to result in any suitable desired multiplication factors (e.g., 8, 16, 32, or greater).

Figure 11:
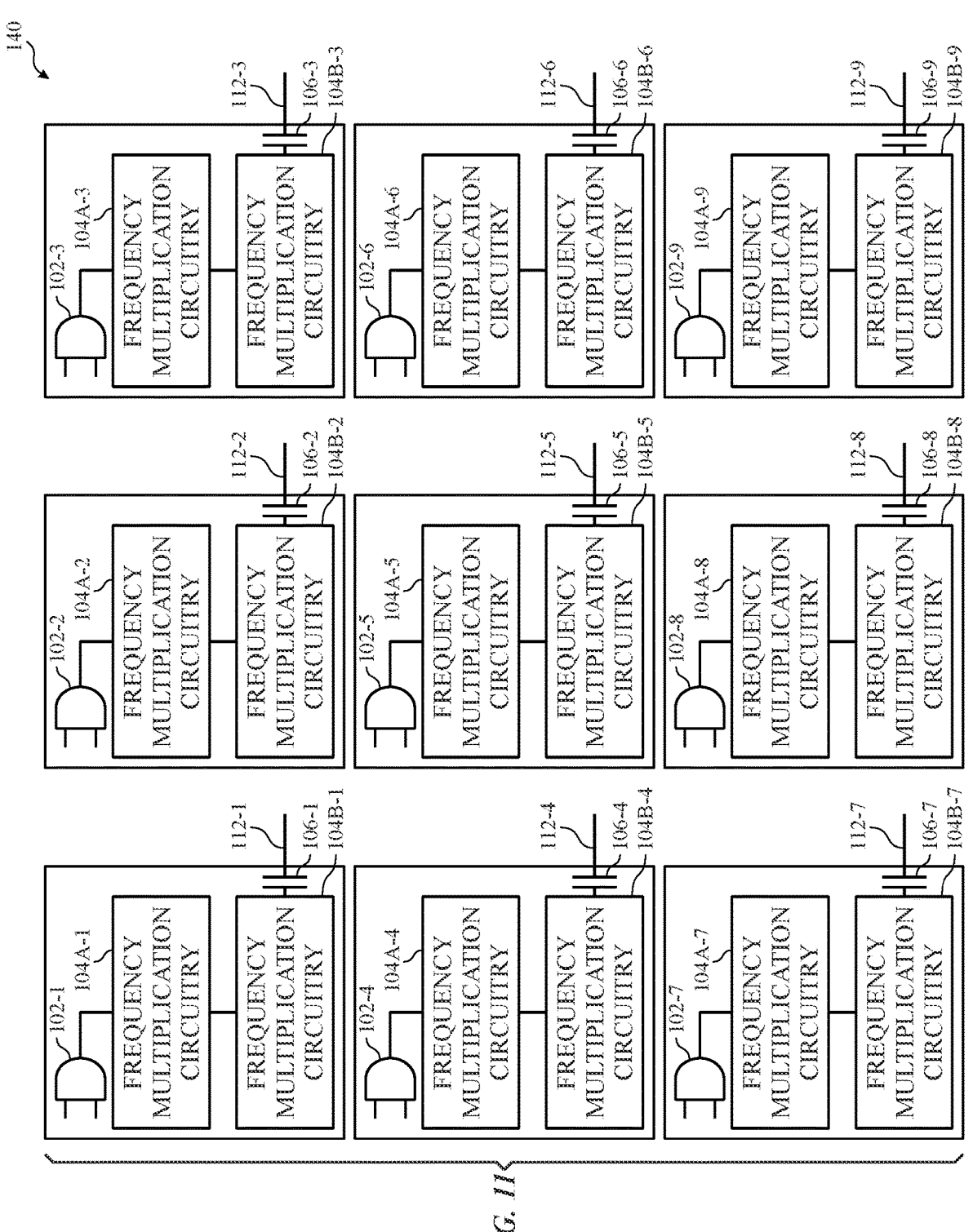
FIG. 11 is a DAC including a second array of the second cells of FIG. 9, in accordance with an embodiment of the present disclosure.

FIG. 11 depicts the DAC 40 including a second array 140 of the second cells 130. Although 8 first cells 100-1, 100-2, 100-3, 100-4, 100-5, 100-6, 100-7, 100-8, and 100-9 are shown in the depicted embodiment, it should be appreciated that in different embodiments, the second array 140 of the DAC 40 may include any number of second cells 130. Moreover, as mentioned above, each second cell 130-1, 130-2, 130-3, 130-4, 130-5, 130-6, 130-7, 130-8, and 130-9 may receive the LO signal 48. Furthermore, the DFE 38 may provide the bitstream 42 targeting one or more of the second cells 130-1, 130-2, 130-3, 130-4, 130-5, 130-6, 130-7, 130-8, and 130-9. For example, the second cells 130-1, 130-2, 130-3, 130-4, 130-5, 130-6, 130-7, 130-8, and 130-9 may receive the LO signal 48 and/or the bitstream 42 with a first frequency. Moreover, each targeted second cell 130-1, 130-2, 130-3, 130-4, 130-5, 130-6, 130-7, 130-8, and/or 130-9 may generate a respective unit power analog signal 112-1, 112-2, 112-3, 112-4, 112-5, 112-6, 112-7, 112-8, and 112-9 with a third frequency, based on each of the two frequency multiplication circuitry 104 including circuitry for providing an output signal based on a multiplication factor (e.g., a 4× multiplication factor). Moreover, the second array 140 may combine (e.g., aggregate) the unit power analog signals 112-1, 112-2, 112-3, 112-4, 112-5, 112-6, 112-7, 112-8, and 112-9 to generate the analog signal 44, as discussed above. In this manner, the second array 140 may generate output signal (e.g., the analog signal 44) with quadruple the frequency of the input signals (e.g., the bitstream 42 and/or the LO signal 48).

Figure 12:
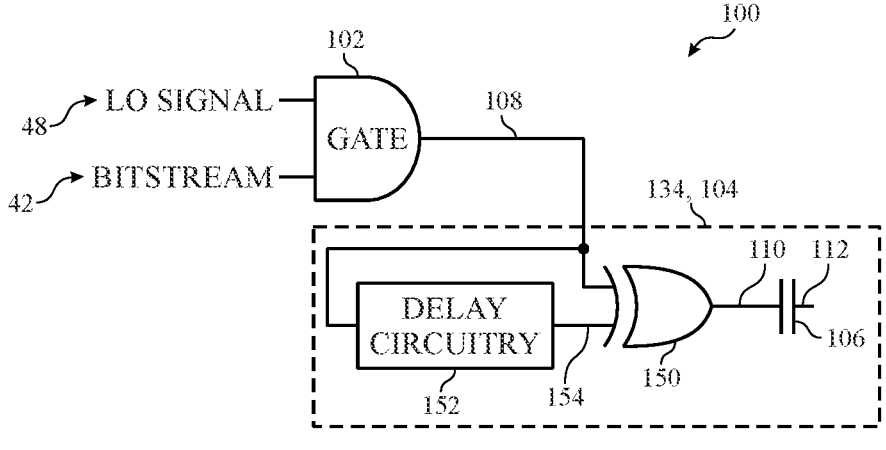
FIG. 12 is a first embodiment of frequency multiplication circuitry of the first cell of FIG. 6 or the second cell of FIG. 9, in accordance with an embodiment of the present disclosure.
Figure 13:
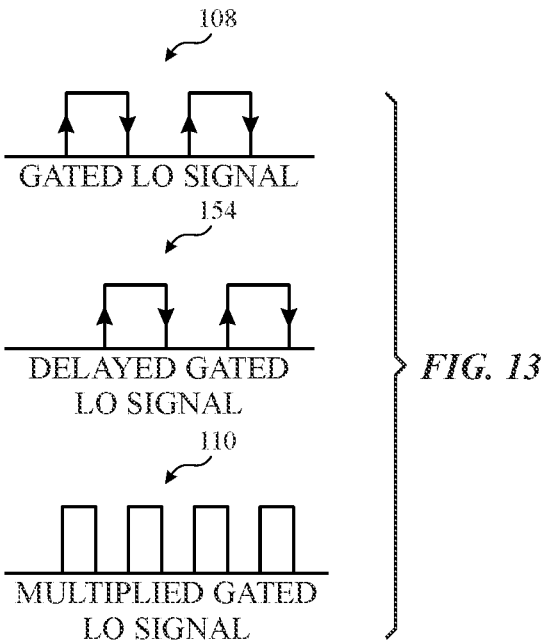
FIG. 13 illustrates the gated LO signal, a delayed gated LO signal, and the multiplied gated LO signal associated with the first embodiment of the frequency multiplication circuitry of FIG. 12, in accordance with an embodiment of the present disclosure.

FIG. 12 depicts a first embodiment of the frequency multiplication circuitry 104 of the first cell 100. Although the first embodiment of the frequency multiplication circuitry 104 is described with respect to the first cell 100, it should be appreciated that the second cell 130 may also include the first embodiment of the frequency multiplication circuitry 104. In the depicted embodiment, the first cell 100 includes a first frequency multiplication circuit 134 including an XOR gate 150 and delay circuitry 152. The delay circuitry 152 may receive the gated LO signal 108 to provide a delayed gated LO signal 154. FIG. 13 depicts the gated LO signal 108, the delayed gated LO signal 154, and the multiplied gated LO signal 110. The delay circuitry 152 may include different circuitry for providing the delayed gated LO signal with a different phase delay (e.g., time delay). For example, the delay circuitry 152 may delay the gated LO signal 108 based on a signal frequency of the gated LO signal 108.

In any case, the XOR gate 150 may receive the gated LO signal 108 and the delayed gated LO signal 154 to provide the multiplied gated LO signal 110. In particular, the XOR gate 150 may compare the gated LO signal 108 and the delayed gated LO signal 154 to generate the multiplied gated LO signal 110. For example, the XOR gate 150 may generate a pulse at each rising edge and each falling edge of the gated LO signal 108 (or the delayed gated LO signal 154). Accordingly, the first frequency multiplication circuit 134 may provide the multiplied gated LO signal 110 with double the frequency of the input gated LO signal 108 (e.g., based on a 2× multiplication factor).

With the foregoing in mind, a phase difference of the gated LO signal 108 and the delayed gated LO signal 154 may correspond to a duration (e.g., duty cycle) of the pulses of the multiplied gated LO signal 110. As mentioned above, the XOR gate 150 may generate the multiplied gated LO signal 110 based on comparing the gated LO signal 108 and the delayed gated LO signal 154. Moreover, the delay circuitry 152 may delay the gated LO signal 108 based on the signal frequency of the gated LO signal 108. For example, the delay circuitry 152 may delay the gated LO signal 108 by a portion (e.g., a quadrant) of a wavelength of the gated LO signal 108. Accordingly, the XOR gate 150 may generate the multiplied gated LO signal 110 with a number of pulses having a duty cycle (e.g., 40% duty cycle, 45% duty cycle, 50% duty cycle, 55% duty cycle, or any other suitable duty cycle) based on the phase difference between the gated LO signal 108 and the delayed gated LO signal 154. For example, in the depicted embodiment of FIG. 13, the delay circuitry 152 provided the delayed gated LO signal 154 with a phase delay equal to (e.g., nearly equal to) a quadrant of a wavelength of the gated LO signal 108. Accordingly, the XOR gate 150 generated the multiplied gated LO signal with a 50% duty cycle (e.g., nearly 50% duty cycle) based on receiving the gated LO signal 108 and the delayed gated LO signal 154 delayed by a quadrant of the wavelength of the gated LO signal 108.

The capacitor 106 may generate the analog signal 44 with an amplitude that is at least partly determined based on the duty cycle of the pulses of the multiplied gated LO signal 110. Moreover, in specific cases, the capacitor 106 may generate the analog signal 44 (e.g., RF signal) with a high (e.g., nearly highest, relatively high, higher than a threshold) amplitude (e.g., efficiency) when receiving the multiplied gated LO signal 110 with a particular duty cycle (e.g., nearly 50% duty cycle). As such, in some embodiments, the delay circuitry 152 may include circuit components to adjust the phase delay for providing the delayed gated LO signal 154. For example, in some cases, increasing the phase delay of the delayed gated LO signal 154 may increase the duty cycle of the multiplied gated LO signal 110. In specific cases, the delay circuitry 152 may include circuitry to adjust the phase delay for providing the delayed gated LO signal 154 for tuning a duty cycle of the pulses of the multiplied gated LO signal 110, improving an output power of the analog signal 44 for transmission, or both. In alternative or additional cases, the delay circuitry 152 may adjust the phase delay for providing the delayed gated LO signal 154 based on a signal frequency of the bitstream 42 and/or the LO signal 48, to tune a signal frequency of the analog signal 44, or both.

Figure 14:
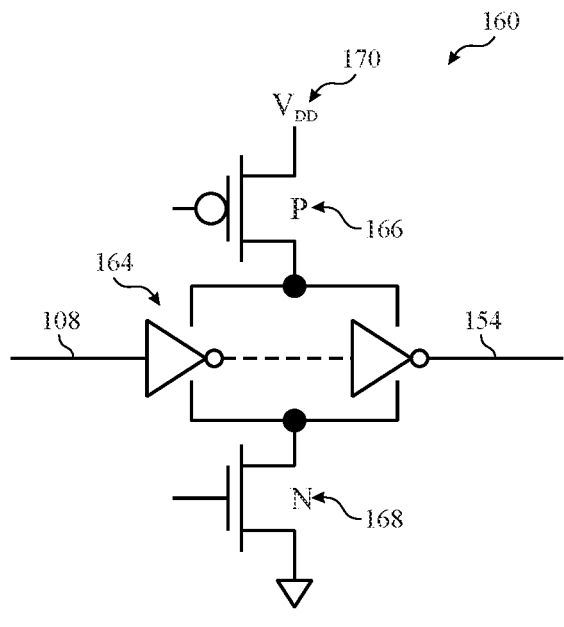
FIG. 14 is a first programmable delay circuit of the frequency multiplication circuitry of FIG. 12, in accordance with an embodiment of the present disclosure.
Figure 15:
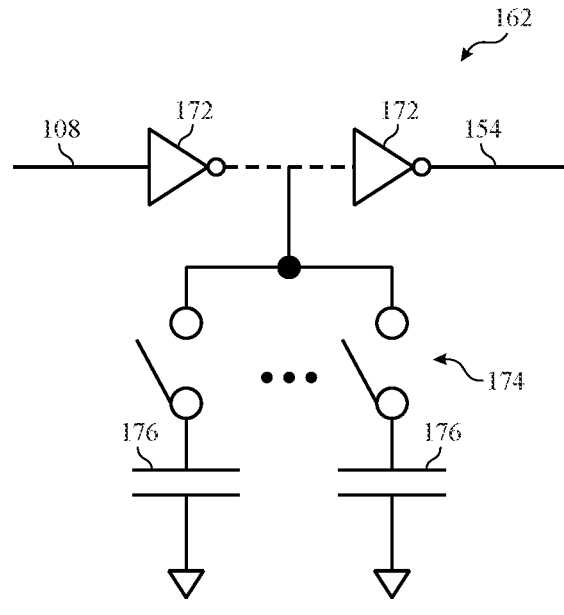
FIG. 15 is a second programmable delay circuit of the frequency multiplication circuitry of FIG. 12, in accordance with an embodiment of the present disclosure.

FIGS. 14 and 15 depict a first and a second embodiment of the delay circuitry 152 to adjust the phase delay for providing the delayed gated LO signal 154, in accordance with various embodiments of the present disclosure. In particular, FIG. 14 depicts a first programmable delay circuit 160 and FIG. 15 depicts a second programmable delay circuit 162. The first programmable delay circuit 160 may include a number of (e.g., an even number of) inverters 164, a number of P-channel metal-oxide-semiconductor field-effect transistor (MOSFETs) 166, and a number of N-channel MOSFETs 168. In some cases, the first programmable delay circuit 160 may include buffers, amplifiers, or any other viable circuitry in place of the inverters 164 (e.g., referred to collectively as delay components).

The P-channel MOSFETs 166 may be coupled to a supply voltage source VDD 170 (e.g., the power source 26) and the inverters 164. Moreover, the N-channel MOSFETs 168 may be coupled to a ground connection and the inverters 164. The processor 12 and/or the DFE 38 may provide control signals to one or more of the P-channel MOSFETs 166 and/or the N-channel MOSFETs 168 to couple or uncouple one or more of the inverters 164 (e.g., one or more pairs of the inverters 164) to adjust the phase delay for providing the delayed gated LO signal 154.

Moreover, the second programmable delay circuit 162 may include inverters 172, a number of switches 174, and a number of capacitors 176. In some cases, the second programmable delay circuit 162 may also include a number of resistors (not shown) in series with the inverters 164. In such cases, the capacitors 176 and the resistors may provide phase delay to the output signal when the respective switches 174 are shorted (e.g., tuned on). For example, the processor 12 and/or the DFE 38 may provide the control signals to couple or uncouple one or more of the switches 174 to adjust the phase delay for providing the delayed gated LO signal 154. Similarly, the second programmable delay circuit 162 may include buffers, amplifiers, or any other viable circuitry in place of the inverters 172 (e.g., referred to collectively as the delay components).

In some cases, conveying signals with a frequency close to or above a transit frequency threshold of one or more circuit components (e.g., semiconductors) of the first cell 100 and/or the second cell 130 may reduce transition times between consecutive pulses (e.g., data bits) of the gated LO signal 108, the delayed gated LO signal 154, and/or the multiplied gated LO signal 110 discussed above. As such, one or more signals traversing through the frequency multiplication circuitry 104 (e.g., the first frequency multiplication circuit 134) may have an angled (e.g., less defined) rising edges and/or falling edges. In such cases, implementing a passive frequency multiplication circuitry may be desirable to detect the rising edges and/or the falling edges of such signals.

FIG. 16 is a flowchart of a process 190 to determine a phase delay for providing the delayed gated LO signal 154 based on a selected transmission frequency of the analog signal 44 when using the first cell 100 and/or the second cell 130 described above. In some cases, the processor 12 may perform the process 190. Although the process 190 is described with respect to the processor 12, alternatively or additionally, any other viable processing circuitry may perform the process 190. For example, the memory 14 and/or storage 16 may include machine readable instructions stored thereon that may cause the processor 12 and/or the other viable processing circuitry to perform the process 190. It should be appreciated that the process blocks of the process 190 are provided by the way of example, and in different embodiments, the processor 12 may perform different process blocks, perform the process blocks in different orders, or skip some process blocks altogether. Moreover, the processor 12 may perform the operations during manufacturing, during a startup procedure of the electronic device 10, prior to initiation of or during data transmission, among other possible instances.

At block 192, the processor 12 receives an indication of a transmission frequency for providing the analog signal 44. In some cases, a base station may provide the indication of the transmission frequency to the electronic device 10 for communication over a frequency channel. Alternatively or additionally, the processor 12 may determine the transmission frequency. At block 194, the processor 12 may set a delay value (e.g., an initial value) of the delay circuitry 152 to a first delay value. For example, an array (e.g., the first array 120 and/or the second array 140) of the DAC 40 may include the first cell 100 and/or the second cell 130 including the first programmable delay circuit 160, the second programmable delay circuit 162, or both. Accordingly, the processor 12 may provide one or more control signals to the first programmable delay circuit 160 and/or the second programmable delay circuit 162 of the first cell 100 and/or the second cell 130 to set the delay. Moreover, in some cases, the processor 12 may determine the first delay value stored on the memory 14 and/or storage 16. For example, the first delay value may be associated with the transmission frequency. At block 196, the processor 12 may determine (e.g., measure) an amplitude of the unit power analog signal 112 generated by the respective first cell 100 and/or the second cell 130. For example, the processor 12 may provide a first bitstream (e.g., a test bitstream) to determine the amplitude of the unit power analog signal 112.

At block 198, the processor 12 may determine whether the amplitude of the unit power analog signal 112 is above a threshold. For example, the threshold may be pre-set or predetermined (e.g., during manufacturing). As such, the processor 12 may receive the threshold based on accessing the memory 14 and/or the storage 16 of the electronic device 10. Alternatively or additionally, the threshold is determined during performing the process 190 to determine a delay value corresponding to a maximum amplitude (e.g., power) of the unit power analog signal 112 for generating the analog signal 44. In such cases, the processor 12 may proceed to block 200 at least a number of times (e.g., 2 times, 3 times, 5 times, 20 times, and so on) before transitioning to the block 202. Accordingly, the processor 12 may determine a threshold corresponding to the delay value corresponding to a maximum amplitude (e.g., power) of the unit power analog signal 112 based on selecting (e.g., testing, sweeping) different delay values for generating the analog signal 44.

In yet alternative or additional cases, at block 198, the threshold is determined during performing the process 190 based on determining a delay value corresponding to minimum amplitude of one or more noise signals of the unit power analog signal 112. For example, the process 190 may proceed to block 200 at least a number of times (e.g., 2 times, 3 times, 5 times, 20 times, and so on) before transitioning to the block 202 to determine a delay value corresponding to least noise levels (e.g., minimum amplitude of one or more harmonic signals of the unit power analog signal 112) of one or more first cells 100 and/or second cells 130 of the array 120 and/or 140 of the DAC 40. Accordingly, the processor 12 may determine the threshold by determining minimum noise amplitude (e.g., minimum amplitude/ power of one or more harmonics) of the unit power analog signal 112 based on selecting (e.g., testing, sweeping) different delay values for generating the analog signal 44.

At block 202, when the amplitude of the unit power analog signal 112 is above the threshold, the processor 12 may set delay values of one or more first cells 100 and/or second cells 130 of the array 120 and/or 140 of the DAC 40 to the delay value. For example, the processor 12 may provide a second bitstream (e.g., transmission bitstream) to the one or more first cells 100 and/or second cells 130 of the array 120 and/or 140 of the DAC 40 for transmission. Subsequently, at block 204, the processor 12 may transmit one or more control signals to the DAC 40 to generate the analog signal 44. Accordingly, the DAC 40 may use the determined phase delay to generate the analog signal 44 with the transmission frequency.

However, when the amplitude of the unit power analog signal 112 is equal to or below the threshold, at block 200, the processor 12 may set the delay value of the delay circuitry to a different delay value (e.g., increasing or decreasing the delay value). For example, the processor 12 may determine the subsequent delay value based on referencing the memory 14 and/or the storage 16. As mentioned above, the processor 12 may also test different delay values (e.g., sweep different delay values) to determine, for example, a delay value corresponding to a maximum amplitude of generated unit power analog signal 112 or a minimum amplitude of one or more harmonics (e.g., minimum power associated with noise signals) of the generated unit power analog signal 112. The processor 12 may test different delay values (e.g., sweep) based on predefined or adjustable incrementing/decrementing delay values. Moreover, the processor may return to the block 196 to measure the amplitude of the unit power analog signal 112 generated by the respective first cell 100 and/or the second cell 130 using the subsequent delay value.

Figure 17:
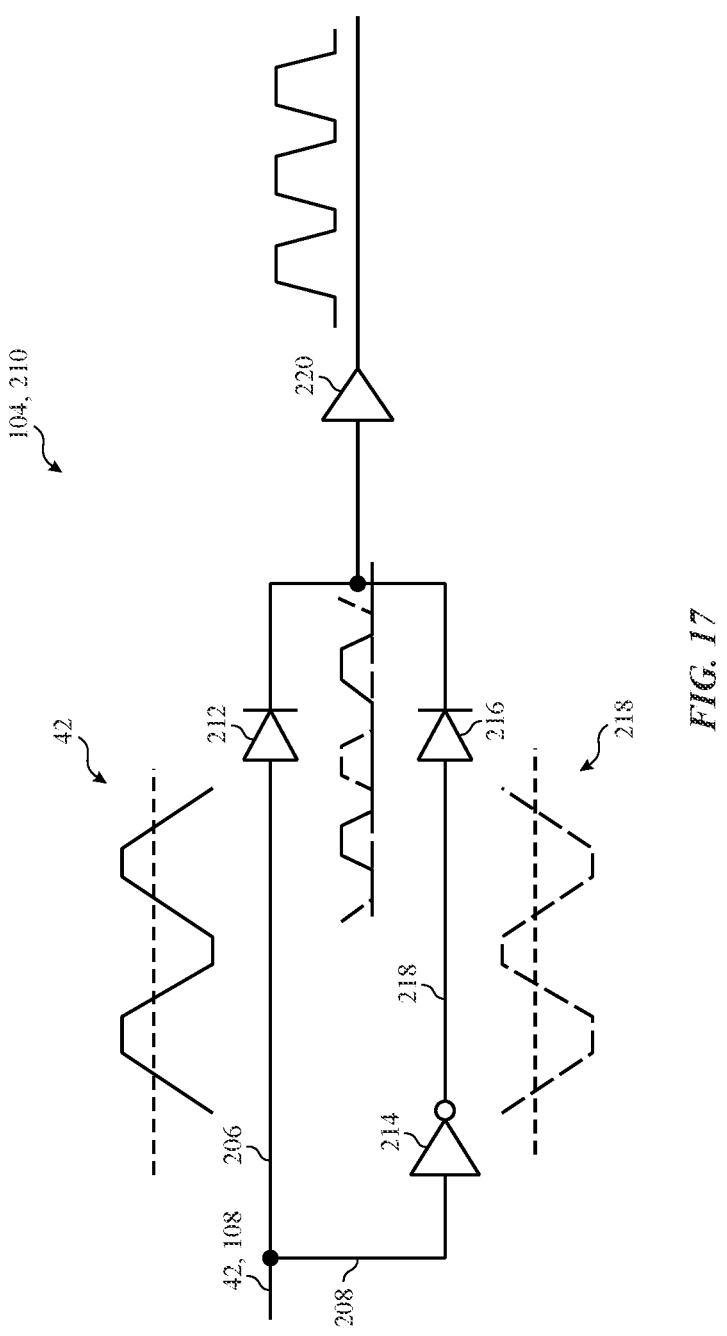
FIG. 17 is a second embodiment of a frequency multiplication circuitry of the first cell of FIG. 6 or the second cell of FIG. 9, in accordance with an embodiment of the present disclosure.

FIG. 17 depicts a second embodiment of the frequency multiplication circuitry 104 (e.g., a passive frequency multiplication circuitry 210) of the first cell 100 and/or the second cell 130. The second frequency multiplication circuit 210 may operate at a higher operating frequency than a transit frequency threshold of the circuit components (e.g., semiconductors) of the first cell 100 and/or the second cell 130 (e.g., higher than 40 GHz, higher than 50 GHz, higher than 60 GHz, and so on). It should be appreciated that the second frequency multiplication circuit 210 may also operate at lower operating frequencies.

In any case, the second frequency multiplication circuit 104 may include a first diode 212 on a first current path 206 and an inverter 214 and a second diode 216 on a second current path 208. The first diode 212 may extract a portion of each pulse of the bitstream 42 (or the gated LO signal 108) above a threshold on the first current path 208. Moreover, the inverter 214 may invert the bitstream 42 (or the gated LO signal 108) to provide an inverted bitstream 218 to the second diode 216. The second diode 216 may extract a portion of each pulse of the inverted bitstream 218 above the threshold on the second current path 208. Accordingly, the first diode 212 and the second diode 216 may increase transition times between consecutive pulses (e.g., data bits) of the bitstream 42 and the inverted bitstream 218. Subsequently, the second frequency multiplication circuit 210 may combine (e.g., aggregate) the rectified bitstream 42 and the rectified inverted bitstream 218 to provide an output signal with double the frequency of the bitstream 42 (e.g., applying a multiplication factor two). In some embodiments, the second frequency multiplication circuit 210 may also include an amplifier 220 to increase an amplitude of the output signal.

In one embodiment, a digital-to-analog converter (DAC) is described. The DAC may include a capacitor, a first gate, and frequency multiplication circuitry. The first gate may receive a local oscillator (LO) signal with a first frequency, receive a bitstream with the first frequency, and output a gated LO signal with the first frequency based on the LO signal and the bitstream. The frequency multiplication circuitry may be coupled to the first gate and the capacitor. The frequency multiplication circuitry may output a multiplied gated LO signal with a second frequency to the capacitor. The second frequency may be higher than the first frequency.

The LO signal may include multiple pulses. Moreover, the gated LO signal may include a portion of the multiple pulses of the LO signal that correspond to the bitstream.

The frequency multiplication circuitry may include a second gate and delay circuitry. The second gate may be coupled to the first gate, the delay circuitry, and the capacitor.

The second gate may include an XOR gate.

The delay circuitry is coupled to the first gate and the second gate. The delay circuitry may output a delayed gated LO signal to the second gate.

The delay circuitry may include multiple delay components and multiple switches. The switches may be coupled to the delay components.

The switches may receive one or more control signals to couple and uncouple one or more of the delay components between the first gate and the second gate.

The frequency multiplication circuitry may include a first diode that may extract a portion of a voltage of the gated LO signal, an inverter that may output an inverted gated LO signal based on receiving the gated LO signal, and a second diode that may extract a portion of a voltage of the inverted gated LO signal. The frequency multiplication circuitry may combine the portion of the voltage of the gated LO signal and the portion of the voltage of the inverted gated LO signal to generate the multiplied gated LO signal.

The second frequency may be double the first frequency.

In another embodiment, an electronic device is described. The electronic device may include a processor, a transmitter, and one or more antennas. The processor may generate a bitstream with a first frequency. The bitstream may correspond to a transmission signal for transmission. The transmitter may be coupled to the processor. The transmitter may include a digital-to-analog converter (DAC) including multiple cells. Moreover, each cell may include first frequency multiplication circuitry that may receive a respective digital input signal with the first frequency, the respective digital input signal corresponding to the bitstream and output a respective first digital output signal with a second frequency, the respective first digital output signal corresponding to the transmission signal. Moreover, the one or more antennas may be coupled to the transmitter. The one or more antennas may transmit the transmission signal based on the respective first digital output signal of each cell of the multiple cells.

The electronic device may include a local oscillator (LO) that may generate an LO signal with the first frequency. Each cell may include a first gate coupled to the first frequency multiplication circuitry. The first gate may receive the LO signal with the first frequency, receive the bitstream with the first frequency, and output the respective first digital input signal with the first frequency to the first frequency multiplication circuitry. The electronic device may also include a capacitor that may receive the respective first digital output signal output by the first frequency multiplication circuitry, output a unit power analog signal with the second frequency, where the unit power analog signal corresponds to a portion of the transmission signal.

The second frequency may be double the first frequency.

Each cell of the DAC may include second frequency multiplication circuitry and a capacitor. The second frequency multiplication circuitry may be coupled to the first frequency multiplication circuitry and the capacitor. The second frequency multiplication circuitry of each cell may receive the respective first digital output signal with the second frequency and output a respective second digital output signal with a third frequency. The capacitor may generate the unit power analog signal with the third frequency.

The third frequency may be quadruple the first frequency.

The electronic device may include a digital phase shifter coupled to the processor and the DAC. The digital phase shifter may receive the bitstream with a first phase and output the bitstream with a second phase based on the first frequency and the second frequency. The electronic device may also include a phase shifter coupled to the DAC and the one or more antennas. The phase shifter may receive a unit power analog signal generated by a capacitor of each cell with a third phase and output the unit power analog signal based on the first frequency and the second frequency.

In yet another embodiment, a method is described. The method may include method receiving a first indication to transmit a first transmission signal with an output frequency by a processor of an electronic device. The method may also include setting a delay value of a delay circuit of a first cell of a digital-to-analog converter (DAC) to a first delay value by the processor. Moreover, the method may also include outputting a first bitstream to the first cell with an input frequency by the processor. Furthermore, the method may include determining a first amplitude of a first unit power analog signal generated by the first cell with the output frequency based on outputting the first bitstream with the first frequency by the processor. The first unit power analog signal may correspond to a portion of the first transmission signal. The method may also include outputting a second bitstream corresponding to the first transmission signal to the first cell with the input frequency for transmission by one or more antennas of the electronic device with the output frequency based on the first amplitude of the first unit power analog signal being above a threshold by the processor.

The method may include setting the delay value of the delay circuit of the cell to a subsequent delay value based on the first amplitude of the first unit power analog signal being below the threshold by the processor.

The method may include receiving a second indication to transmit a second transmission signal with a second output frequency by the processor, setting the delay value of the delay circuit of the first cell of the DAC to a second delay value by the processor, outputting a third bitstream to the first cell with the input frequency by the processor, and determining a second amplitude of a second unit power analog signal generated by the first cell with the second output frequency based on outputting the third bitstream with the input frequency by the processor. The second unit power analog signal corresponding to a portion of the second transmission signal. The method may also include outputting a fourth bitstream corresponding to the second transmission signal to the first cell with the input frequency for transmission by the one or more antennas of the electronic device with the second output frequency based on the second amplitude of the second unit power analog signal being above the threshold by the processor.

The method may include receiving a predetermined value associated with the threshold or determining the threshold based on determining the first amplitude of the first unit power analog signal by the processor.

The output frequency may be double or quadruple the input frequency.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A radio frequency (RF) transmitter comprising:
a local oscillator (LO) configured to output a LO signal with a first frequency; and
a digital-to-analog converter (DAC) coupled to the LO, the DAC receiving the LO signal from the LO, the DAC comprising a plurality of cells, each cell of the plurality of cells comprising first frequency multiplication circuitry and a capacitor, and each cell of the plurality of cells configured to
receive the LO signal having the first frequency,
receive a bitstream having the first frequency, and
output an analog signal corresponding to the bitstream with a second frequency based on combining a portion of a voltage of the bitstream, a portion of a voltage of an inverted bitstream that is based on the bitstream, and the LO signal, the second frequency being greater than the first frequency.

2. The RF transmitter of claim 1, wherein the first frequency multiplication circuitry of each cell of the plurality of cells is configured to output the bitstream with the second frequency to the respective capacitor of the cell, the respective capacitor of each cell being configured to generate a respective unit power analog signal.

3. The RF transmitter of claim 1, wherein each cell of the plurality of cells comprises second frequency multiplication circuitry, the second frequency multiplication circuitry of each cell configured to
receive the bitstream with the second frequency from the first frequency multiplication circuitry, and
output the bitstream with a third frequency, the third frequency being double the second frequency.

4. The RF transmitter of claim 1, wherein each cell of the plurality of cells comprises a first gate configured to output the bitstream with the first frequency to the first frequency multiplication circuitry based on the LO signal.

5. The RF transmitter of claim 1, wherein the first frequency multiplication circuitry of each cell of the plurality of cells comprises a second gate and delay circuitry, the delay circuitry of each cell comprising a plurality of selectable delay components configured to delay the bitstream.

6. The RF transmitter of claim 5, wherein the delay circuitry is configured to output a delayed LO signal with the first frequency based on the selectable delay components, the second gate being configured to output the bitstream with the second frequency based on the bitstream and the delayed LO signal.

7. The RF transmitter of claim 1, wherein the first frequency multiplication circuitry comprises a first diode configured to extract the portion of the voltage of the bitstream, an inverter configured to output the inverted bitstream based on the bitstream, and a second diode configured to extract the portion of the voltage of the inverted bitstream, the first frequency multiplication circuitry being configured to combine the portion of the voltage of the bitstream and the portion of the voltage of the inverted bitstream to generate the bitstream with the second frequency.

8. The RF transmitter of claim 1, wherein each cell of the plurality of cells is configured to only receive the LO signal as a clock signal.

9. An electronic device comprising:

a processor configured to generate a bitstream with a first frequency, the bitstream corresponding to a transmission signal;

one or more antennas configured to transmit the transmission signal; and a transmitter comprising a digital-to-analog converter (DAC) coupled to the processor, the DAC configured to receive a local oscillator (LO) signal from an LO, receive the bitstream from the processor, and output an analog signal corresponding to the transmission signal based on combining a portion of a voltage of the bitstream, a portion of a voltage of an inverted bitstream that is based on the bitstream, and the LO signal, the analog signal having a second frequency greater than the first frequency.

10. The electronic device of claim 9, wherein the transmitter does not include a mixer.

11. The electronic device of claim 9, wherein the DAC comprises a plurality of cells, each cell of the plurality of cells comprising a capacitor, a first gate configured to receive the LO signal with the first frequency, receive the bitstream with the first frequency, and output a gated LO signal with the first frequency based on the LO signal and the bitstream, and a first frequency multiplication circuitry coupled to the first gate, the first frequency multiplication circuitry configured to output a multiplied gated LO signal based on the gated LO signal, the capacitor being configured to generate the analog signal with the second frequency based on the multiplied gated LO signal.

12. The electronic device of claim 11, wherein the first frequency multiplication circuitry is configured to output the multiplied gated LO signal with the second frequency, the second frequency being double the first frequency.

13. The electronic device of claim 11, wherein each cell of the plurality of cells comprises a second frequency multiplication circuitry coupled to the first frequency multiplication circuitry and the capacitor, the second frequency multiplication circuitry configured to output a double multiplied gated LO signal with the second frequency to the capacitor based on the multiplied gated LO signal, the capacitor being configured to generate the analog signal with the second frequency.

14. The electronic device of claim 13, wherein the second frequency is quadruple the first frequency.

15. The electronic device of claim 9, comprising an LO phase shifter coupled to the LO and the DAC, the LO phase shifter configured to receive the LO signal comprising an in-phase component and a quadrature component having a first phase difference and output the LO signal comprising the in-phase component and the quadrature component with a second phase difference based on the first frequency and the second frequency, and a digital phase shifter coupled to the processor and the DAC, the digital phase shifter configured to receive the bitstream having a first phase and output the bitstream with a second phase based on the first frequency and the second frequency.

16. The electronic device of claim 9, comprising a phase shifter coupled to the DAC and the one or more antennas, the phase shifter configured to receive the analog signal with a first phase and output the analog signal with a second phase based on the first frequency and the second frequency.

17. A method comprising receiving, by a processor of an electronic device, an indication to transmit a transmission signal with a first frequency;

providing, by the processor, one or more control signals to a digital-to-analog converter (DAC), the one or more control signals configured to select a frequency multiplication factor of the DAC for generating the transmission signal; and providing, by the processor, a bitstream with a second frequency to the DAC to cause the DAC to output an analog signal corresponding to the transmission signal based on combining a portion of a voltage of the bitstream, a portion of a voltage of an inverted bitstream that is based on the bitstream, and a local oscillator (LO) signal, the analog signal having the first frequency, and the second frequency being a fraction of the first frequency based on the frequency multiplication factor.

18. The method of claim 17, wherein the frequency multiplication factor is two.

19. The method of claim 17, wherein the second frequency is based on an operating frequency of a LO associated with the DAC.

20. The method of claim 17, wherein the DAC comprises a plurality of cells, one or more targeted cells of the plurality of cells being configured to generate a number of unit power analog signals with the first frequency, each unit power analog signal of the number of unit power analog signals corresponding to a portion of the transmission signal.

* * * * *